(12) United States Patent
Verma et al.

(10) Patent No.: US 6,638,844 B1
(45) Date of Patent: Oct. 28, 2003

(54) METHOD OF REDUCING SUBSTRATE COUPLING/NOISE FOR RADIO FREQUENCY CMOS (RFCMOS) COMPONENTS IN SEMICONDUCTOR TECHNOLOGY BY BACKSIDE TRENCH AND FILL

(75) Inventors: Purakh Raj Verma, Singapore (SG); Sanford Chu, Singapore (SG); Chit Hwei, Singapore (SG); Lap Chan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 15 days.

(21) Appl. No.: 10/207,549

(22) Filed: Jul. 29, 2002

(51) Int. Cl.$^7$ ............................................... H01L 21/44
(52) U.S. Cl. ..................... 438/598; 438/599; 438/622; 438/668; 438/155; 257/531; 257/516
(58) Field of Search .................... 438/598, 597, 438/622, 667, 668, 106–109, 612–614, 396, 397

(56) References Cited

U.S. PATENT DOCUMENTS

| | | | |
|---|---|---|---|
| 5,520,299 A | 5/1996 | Belcher et al. | 216/66 |
| 6,100,199 A | 8/2000 | Joshi et al. | 438/694 |
| 6,287,932 B2 | 9/2001 | Forbes et al. | 438/381 |
| 6,303,423 B1 | 10/2001 | Lin | 438/238 |
| 6,448,168 B1 * | 9/2002 | Rao et al. | 438/598 |

* cited by examiner

Primary Examiner—D Le
(74) Attorney, Agent, or Firm—George O. Saile; Rosemary L. S. Pike; Stephen G. Stanton

(57) ABSTRACT

A method of reducing substrate coupling and noise for one or more RFCMOS components comprising the following steps. A substrate having a frontside and a backside is provided. One or more RFCMOS components are formed over the substrate. One or more isolation structures are formed within the substrate proximate the one or more RFCOMS components. The backside of the substrate is etched to form respective trenches within the substrate and over at least the one or more isolation structures. The respective trenches are filled with dielectric material whereby the substrate coupling and noise for the one or more RFCMOS components are reduced.

70 Claims, 5 Drawing Sheets

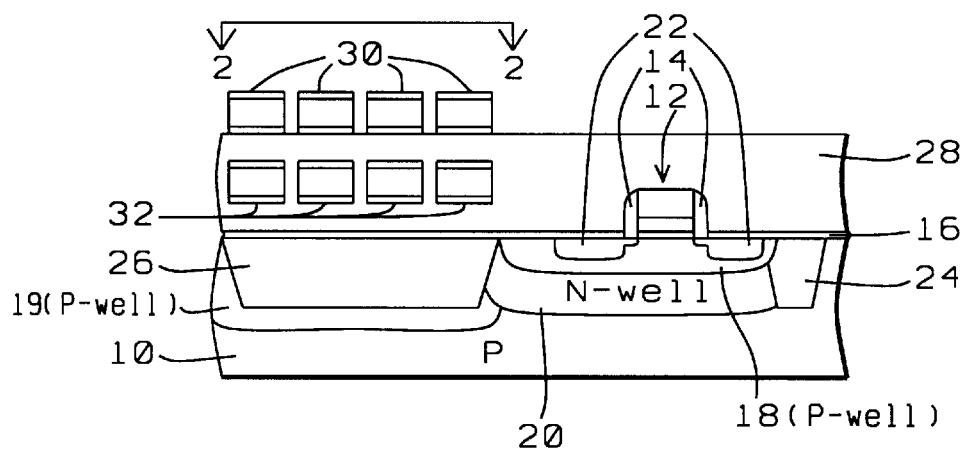
*FIG. 1 — Prior Art*
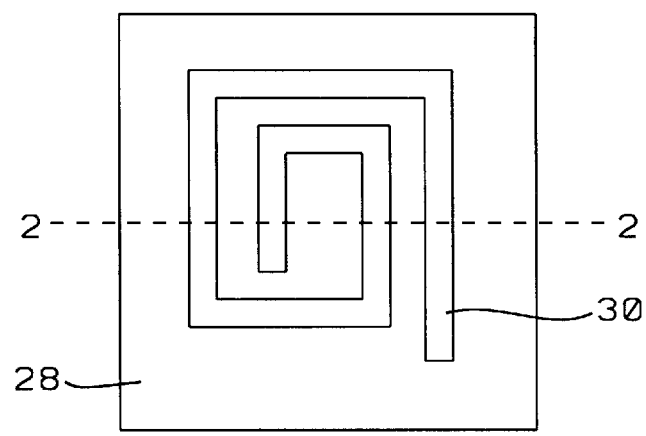
*FIG. 2 — Prior Art*

US 6,638,844 B1

METHOD OF REDUCING SUBSTRATE COUPLING/NOISE FOR RADIO FREQUENCY CMOS (RFCMOS) COMPONENTS IN SEMICONDUCTOR TECHNOLOGY BY BACKSIDE TRENCH AND FILL

FIELD OF THE INVENTION

The present invention relates generally to fabrication of semiconductor devices, and more specifically to methods of fabricating RFCMOS components.

BACKGROUND OF THE INVENTION

As shown in FIG. 1, conventional radio frequency complimentary metal-oxide semiconductor (RFCMOS) components utilize conductive metal/polysilicon and silicide shields for inductors and a triple-well approach for transistor noise reduction. That is, a gate electrode 12 is formed over P-substrate 10 and underlying P-well 18, N-well 20 and standard P-well 19. Sidewall spacers 14 are formed over the side walls of gate electrode 12 with source/drain implants 22 extending therefrom within substrate 10. A resist protect oxide (RPO) layer 16 is formed over the substrate 10 adjacent gate electrode 12.

Shallow trench isolation (STI) structures 24, 26 are formed within substrate 10 to electrically isolate gate electrode 12 with STI structure 26 formed beneath inductor coils 30. An interlevel dielectric (ILD) layer or intermetal dielectric (IMD) layer 28 is formed over gate electrode 12 and RPO layer 16.

Inductor coils 30 are formed over ILD/IMD layer 28 with corresponding field plate coils 32 formed under inductor coils 30 within ILD/IMD layer 28. Inductor coils 30/field plate coils 32 are formed over STI structure 26, for example. FIG. 2 is a plan view of FIG. 1 taken along line 2—2 showing the coiled nature of inductor coil(s) 30.

Although substrate coupling and noise are reduced, they are not sufficiently reduced to desired levels.

U.S. Pat. No. 5,520,299 to Belcher et al. describes a backside trench etch process.

U.S. Pat. No. 6,287,932 B2 to Forbes et al. describes a spiral inductor process with insulating layers.

U.S. Pat. No. 6,100,199 to Joshi et al. describes a method for forming embedded thermal conductors for semiconductor chips using a backside trench etch process.

U.S. Pat. No. 6,303,423 B1 to Lin describes a method for forming high performance system-on-chip using post passivation process. High quality electrical components, such as inductors, capacitors or resistors, are formed on a layer of passivation or on the surface of a thick layer of polymer.

SUMMARY OF THE INVENTION

Accordingly, it is an object of the present invention to provide an improved method of fabricating RFCMOS components.

It is another object of the present invention to provide a method to fabricate on-chip inductors with minimal substrate coupling.

Other objects will appear hereinafter.

It has now been discovered that the above and other objects of the present invention may be accomplished in the following manner. Specifically, a substrate having a frontside and a backside is provided. One or more RFCMOS components are formed over the substrate. One or more isolation structures are formed within the substrate proximate the one or more RFCOMS components. The backside of the substrate is etched to form respective trenches within the substrate and over at least the one or more isolation structures. The respective trenches are filled with dielectric material whereby the substrate coupling and noise for the one or more RFCMOS components are reduced.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which:

FIG. 1 is a schematic illustration of prior art RFCMOS component structures.

FIG. 2 is a plan view of FIG. 1 taken along line 2—2.

DETAILED DESCRIPTION OF THE PREFERRED EMBODIMENTS

For the purposes of this invention, a low-k dielectric material has a dielectric constant of less than about 3.

Initial Structure

Figure 3:
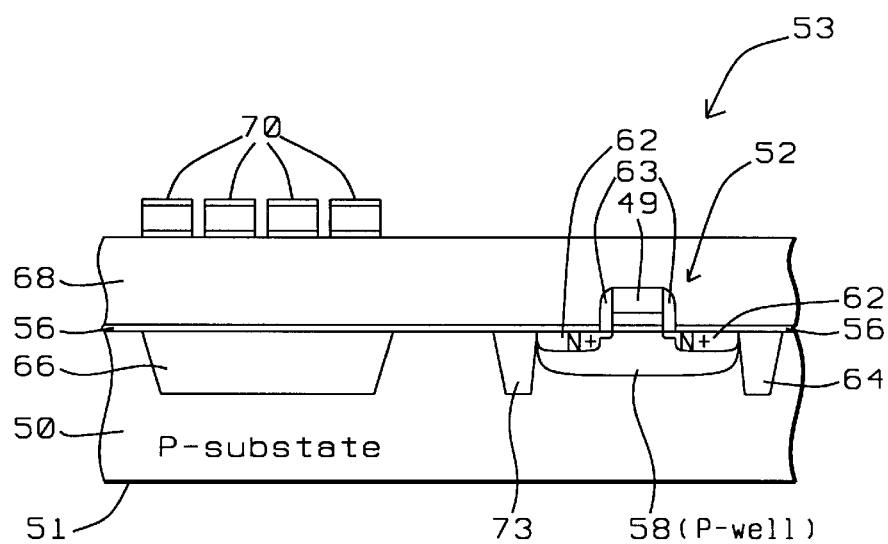
FIGS. 3 to 7 schematically illustrate in cross-sectional representation a preferred embodiment of the present invention with FIGS. 4 to 6 being an inverted cross-sectional representation of successive processing the structure of FIG. 3.

As shown in FIG. 3, radio frequency complimentary metal-oxide semiconductor (RFNMOS) components section 53 include a MOS transistor 52 having a gate electrode 49 formed over substrate/semiconductor wafer 50 and underlying P-well 58. Only two wells are required in the present invention.

Substrate 50 is preferably an N-type or a P-type wafer and is preferably comprised of silicon (Si) or germanium (Ge). Substrate/wafer 50 includes a backside 51.

Sidewall spacers 64 are formed over the side walls of gate electrode 49 of MOS transistor 52 with source/drain implants 62 extending therefrom within substrate 50. A resist protect oxide (RPO) layer 56 is formed over the substrate 50 adjacent gate electrode 52. RPO layer 56 is preferably from about 20 to 100 Å thick and more preferably from about 20 to 50 Å.

Shallow trench isolation (STI) structures 64, 73 are formed within substrate 50 proximate gate electrode 52 and serve to electrically isolate gate electrode 52. An interlevel dielectric (ILD) layer or intermetal dielectric (IMD) layer 68 is formed over gate electrode 49 and RPO layer 56. ILD/IMD layer 68 is preferably from about 20,000 to 50,000 Å thick and is more preferably from about 40,000 to 50,000 Å thick and is preferably comprised of HDP CVD oxide, PE TEOS, HD TEOS, ozone TEOS or low-k dielectric materials and is more preferably low-k dielectric materials.

Inductor coils 70 are formed over ILD/IMD layer 68 and over an inductor STI structure 66 so that inductor STI 66 serves to partially electrically isolate inductor coils 70. It is noted that field plate coils are not needed beneath the inductor coils 70 in the present invention.

Flip Wafer 50 and Etch Trenches 80, 82

Figure 4:
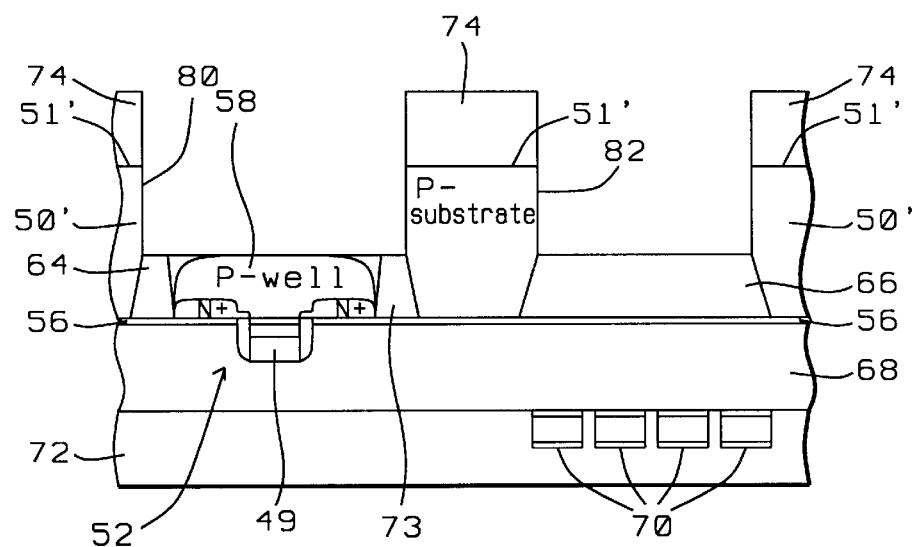

As shown in FIG. 4, a protection layer 72 is formed over inductor coils 70 and ILD/IMD layer 68 to protect them from subsequent processing. Protection layer 72 is formed to a thickness of preferably from about 5000 to 10,000 Å and more preferably from about 5000 to 7000 Å. Protection layer 72 is preferably comprised of PE TEOS, oxide, nitride, $SiO_2+SiN$, polyimide or low-k dielectric materials and more preferably low-k dielectric materials.

Wafer 50 is then inverted to expose backside 51 and a patterned masking layer 74 is formed over the backside 51 of wafer 50 to a thickness of preferably from about 10,000 to 30,000 Å and more preferably from about 10,000 to 20,000 Å. Patterned masking layer 74 is preferably comprised of photoresist, positive photoresist or polyimide and is more preferably positive photoresist.

Patterned masking layer 74 exposed portions of the backside 51 of wafer 50 now above STI's 64, 73 and gate electrode 52; and above inductor STI 66.

Using patterned masking layer 74 as a mask, wafer 50 is etched through backside 51 to form: gate electrode trench 80 exposing STI's 64, 73 and at least a portion of N-well 60 between STI's 64, 73; and inductor trench 82 exposing inductor STI 66.

Filling Trenches 80, 82 With Dielectric Material Layer 90

Figure 5:
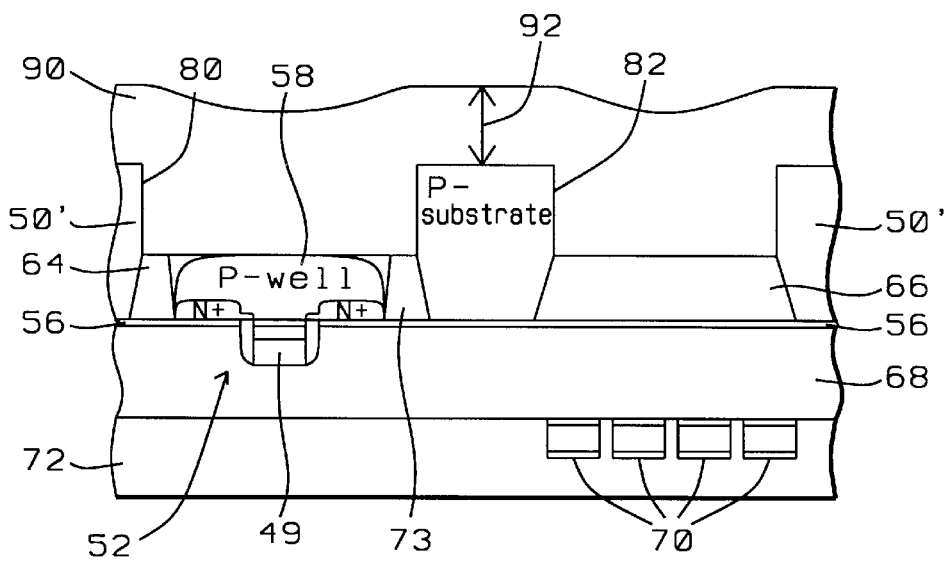

As shown in FIG. 5, patterned masking layer 74 is removed and the structure is cleaned as necessary. A dielectric material layer 90, preferably a low-k dielectric material, is then formed over etched wafer 50', at least filling trenches 80, 82 using a backside fill process. Dielectric material layer 90 is preferably formed to a thickness 92 of preferably from about 5 to 300 μm above etched wafer 50' and more preferably from about 10 to 100 μm.

Dielectric material layer 90 is preferably comprised of a dielectric material such as $SiO_2$, polyimide or a low-k dielectric material covered by a low temperature deposited oxide and is more preferably comprised of a low-k dielectric material fill covered by a low temperature deposited oxide.

Planarization of Dielectric Material Layer 90

Figure 6:
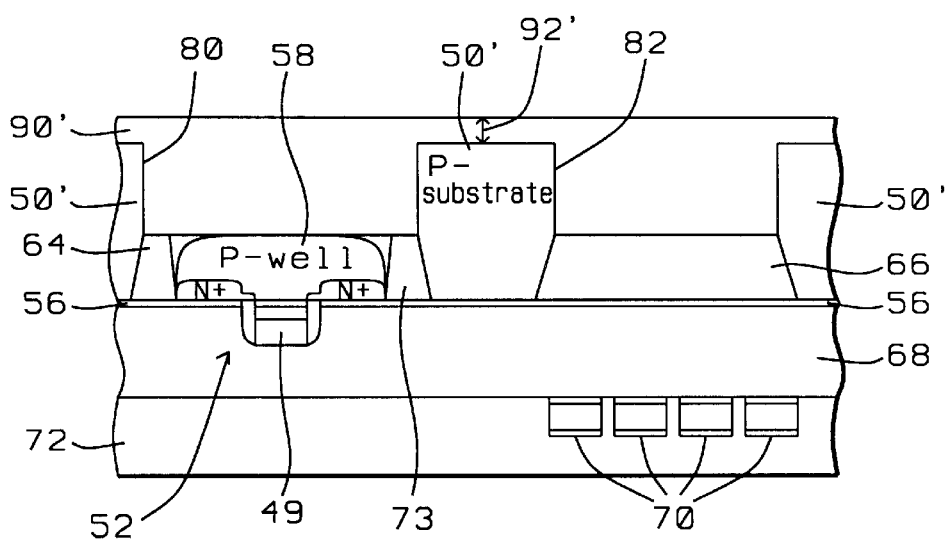

As shown in FIG. 6, dielectric material layer 90 is planarized to form planarized dielectric material layer 90 having a thickness 92' of preferably from about 0 to 5000 Å above etched wafer 50' and more preferably from about 0 to 1000 Å. It is not mandatory for the planarized dielectric material 90' to be above etched wafer 50' (hence the possible 0 Å thickness 92') for the sake of mechanical strength. Ideally, air-gaps are best from an RF coupling point of view.

Dielectric material layer 90 is preferably planarized using a chemical mechanical polishing (CMP) process.

Optional Removal of Protection Layer 72

Figure 7:
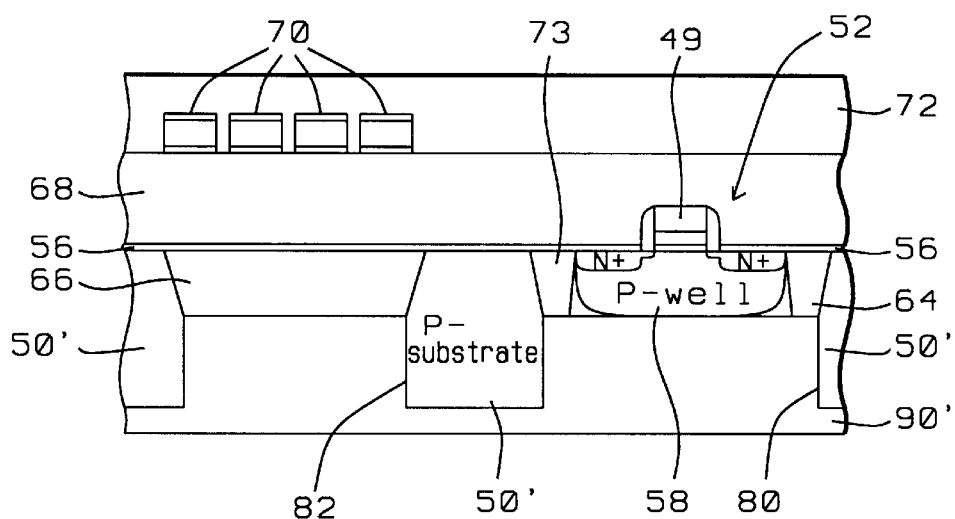

As shown in FIG. 7, the etched wafer 50' is again inverted 'right-side-up'. Protection layer 72 may then be optionally removed from over inductor coils 70 and ILD/IMD layer 68 (although this is not required) and the structure may be cleaned as necessary. Protection layer 72 may be comprised of a oxide, nitride or polyimide passivation layer, for example. Only a cleaning step will be required after the backside CMP (see above).

Then standard front side pad openings 80 (see FIG. 9) may be used to open protection layer 72 in the pad area(s), if not removed, and wire bond connection pads may be formed for the entire chip.

Figure 9:
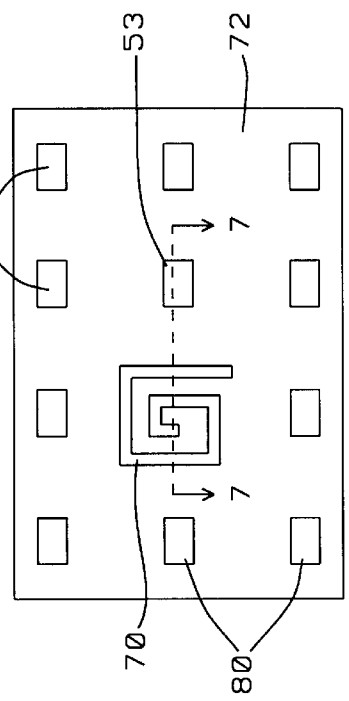
FIG. 9 is a plan view of the backside of a single chip locating the position of the structure of FIGS. 3 to 7.

FIG. 9 is a plan view of a larger portion of wafer 50 showing the backside 51 of wafer 50, inductor coil 70 and RFCMOS (RFNMOS transistor) transistor 52 with FIG. 7 being a cross-sectional view along line 7—7. FIG. 9 shows pad openings 80 formed through protection layer 72.

As shown in FIG. 9, only RFCMOS transistors, such as RFNMOS transistor 53, having inductor coils, inductor coils 70 for example, are etched and back-filled with dielectric material layer 90.

Further processing may then proceed.

Figure 8:
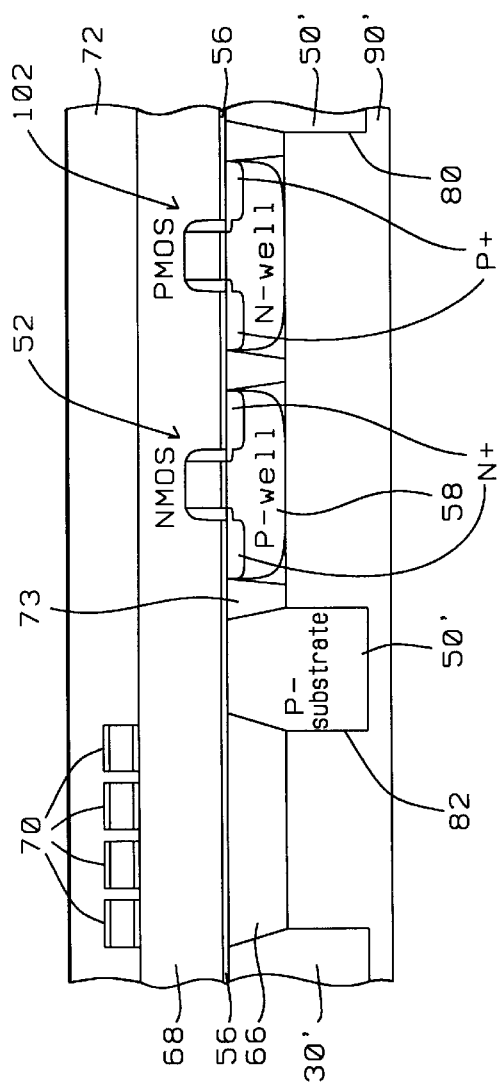
FIG. 8 schematically illustrates in cross-sectional representation an alternate embodiment of FIG. 7. when a pair of RFCMOS transistors are formed.

FIG. 8 illustrates an alternate embodiment of FIG. 7 showing an example of first forming at least two adjacent RFCMOS transistors 52, 102 and then processing according to the teachings of the present invention. As shown in FIG. 8, the RFCMOS transistors may include an RFNMOS transistor 52 and an RFPMOS transistor 102. One skilled in the art would recognize that the transistors 52, 102 illustrated in FIG. 8 may include: two RFNMOS transistors; two RFPMOS transistors; one RFNMOS transistor and one RFPMOS transistor and that more than two RFCMOS transistors may be formed over the substrate/semiconductor wafer 50 in any variety of RFNMOS and RFPMOS transistors.

Filling of trenches 80, 82 with planarized dielectric material layer 90' greatly reduces the noise/substrate coupling to the level of that for a silicon-on-insulator (SOI) while being a simple and manufacturable technique. Further, there is no need for triple-well MOS transistor 52 designs or complicated shield designs for the inductor coils 70.

Advantages of the Invention

The advantages of one or more embodiments of the present invention include:

1) a drastic reduction of substrate coupling of RF from RF components to the substrate;

2) a significant increase in the Q Factor of the inductor;

3) elimination of two chip solution (one CMOS and the other passive components and the complicated flip-chip requirements of RF ICS; and 4) a simple and manufacturable technique.

While particular embodiments of the present invention have been illustrated and described, it is not intended to limit the invention, except as defined by the following claims.

We claim:

1. A method of reducing substrate coupling and noise for one or more radio frequency complimentary metal-oxide semiconductor (RFCMOS) components, comprising the steps of:

providing a substrate having a frontside and a backside;

forming one or more RFCMOS components over the substrate;

forming one or more isolation structures within the substrate proximate the one or more (RFCMOS) components;

etching the backside of the substrate to form respective trenches within the substrate and over at least the one or more isolation structures; and filling the respective trenches with dielectric material whereby the substrate coupling and noise for the one or more RFCMOS components are reduced.

2. The method of claim 1, wherein the substrate is a P-type substrate or an N-type substrate.

3. The method of claim 1, wherein the substrate is comprised of a material selected from the group consisting of silicon and germanium.

4. The method of claim 1, wherein the substrate is a semiconductor wafer.

5. The method of claim 1, wherein the one or more RFCMOS components comprise a MOS transistor formed upon the substrate and inductor coils formed over an inter-level dielectric (ILD) layer or an intermetal dielectric (IMD) layer formed over the MOS transistor.

6. The method of claim 1, wherein the dielectric material filling the trenches is comprised of a material selected from the group consisting of $SiO_2$, polyimide and a low-k dielectric material covered by a low temperature deposited oxide.

7. The method of claim 1, wherein the dielectric material filling the trenches is a low-k dielectric material having a dielectric constant of less than about 3 that is covered by a low temperature deposited oxide.

8. The method of claim 1, wherein the dielectric material filling the trenches is planarized.

9. The method of claim 1, wherein the dielectric material filling the trenches is planarized using a chemical mechanical polishing (CMP) process.

10. The method of claim 1, wherein the dielectric material filling the trenches is formed to a thickness of from about 5 to 300 µm above the etched substrate.

11. The method of claim 1, wherein the dielectric material 90 filling the trenches is formed to a thickness of from about 10 to 100 µm above the etched substrate.

12. The method of claim 1, wherein the dielectric material filling the trenches is planarized to a thickness of from about 0 to 5000 Å above the etched substrate.

13. The method of claim 1, wherein the dielectric material filling the trenches is planarized by a chemical mechanical process to a thickness of from about 0 to 1000 Å above the etched substrate.

14. The method of claim 1, wherein the respective trenches are etched within the backside of the substrate using a patterned masking layer formed over the backside of the substrate.

15. The method of claim 1, wherein the respective trenches are etched within the backside of the substrate using a patterned masking layer formed over the backside of the substrate; the patterned masking layer being comprised of a material selected from the group consisting of photoresist, positive photoresist and polyimide.

16. The method of claim 1, wherein the respective trenches are etched within the backside of the substrate using a patterned masking layer formed over the backside of the substrate; the patterned masking layer being comprised of positive photoresist.

17. The method of claim 1, wherein the respective trenches expose the one or more isolation structures.

18. The method of claim 1, wherein a protection layer is formed over the one or more isolation structures before the backside of the substrate is etched to form the respective trenches.

19. The method of claim 1, wherein the one or more RFCMOS components comprise an radio frequency N-type metal-oxide semiconductor (RFNMOS) transistor.

20. The method of claim 1, wherein the one or more RFCMOS components comprise multiple RFNMOS transistor.

21. The method of claim 1, wherein the one or more RFCMOS components comprise an radio frequency P-type metal-oxide semiconductor (RFPMOS) transistor.

22. The method of claim 1, wherein the one or more RFCMOS components comprise multiple RFPMOS transistor.

23. The method of claim 1, wherein the one or more RFCMOS components comprise an RFNMOS transistor and an RFPMOS transistor.

24. The method of claim 1, wherein the one or more RFCMOS components comprise one or more RFNMOS transistors and one or more RFPMOS transistors.

25. A method of reducing substrate coupling and noise for one or more radio frequency complimentary metal-oxide semiconductor (RFCMOS) components, comprising the steps of:
    providing a substrate having a frontside and a backside; wherein the substrate is a P-type substrate or an N-type substrate;
    forming one or more RFCMOS components over the substrate;
    forming one or more isolation structures within the substrate proximate the one or more (RFCMOS) components;
    etching the backside of the substrate to form respective trenches within the substrate and over at least the one or more isolation structures; and
    filling the respective trenches with dielectric material whereby the substrate coupling and noise for the one or more RFCMOS components are reduced.

26. The method of claim 25, wherein the substrate is comprised of a material selected from the group consisting of silicon and germanium.

27. The method of claim 25, wherein the substrate is a semiconductor wafer.

28. The method of claim 25, wherein the one or more RFCMOS components comprise a MOS transistor formed upon the substrate and inductor coils formed over an inter-level dielectric (ILD) layer or an intermetal dielectric (IMD) layer formed over the MOS transistor.

29. The method of claim 25, wherein the dielectric material filling the trenches is comprised of a material selected from the group consisting of $SiO_2$, polyimide and a low-k dielectric material covered by a low temperature deposited oxide.

30. The method of claim 25, wherein the dielectric material filling the trenches is a low-k dielectric material having a dielectric constant of less than about 3 that is covered by a low temperature deposited oxide.

31. The method of claim 25, wherein the dielectric material filling the trenches is planarized.

32. The method of claim 25, wherein the dielectric material filling the trenches is planarized using a chemical mechanical polishing (CMP) process.

33. The method of claim 25, wherein the dielectric material filling the trenches is formed to a thickness of from about 5 to 300 µm above the etched substrate.

34. The method of claim 25, wherein the dielectric material 90 filling the trenches is formed to a thickness of from about 10 to 100 µm above the etched substrate.

35. The method of claim 25, wherein the dielectric material filling the trenches is planarized to a thickness of from about 0 to 5000 Å above the etched substrate.

36. The method of claim 25, wherein the dielectric material filling the trenches is planarized by a chemical mechanical process to a thickness of from about 0 to 1000 Å above the etched substrate.

37. The method of claim 25, wherein the respective trenches are etched within the backside of the substrate using a patterned masking layer formed over the backside of the substrate.

38. The method of claim 25, wherein the respective trenches are etched within the backside of the substrate using a patterned masking layer formed over the backside of the substrate; the patterned masking layer being comprised of a material selected from the group consisting of photoresist, positive photoresist and polyimide.

39. The method of claim 25, wherein the respective trenches are etched within the backside of the substrate using a patterned masking layer formed over the backside of the substrate; the patterned masking layer being comprised of positive photoresist.

40. The method of claim 25, wherein the respective trenches expose the one or more isolation structures.

41. The method of claim 25, wherein a protection layer is formed over the one or more isolation structures before the backside of the substrate is etched to form the respective trenches.

42. The method of claim 25, wherein the one or more RFCMOS components comprise an radio frequency N-type metal-oxide semiconductor (RFNMOS) transistor.

43. The method of claim 25, wherein the one or more RFCMOS components comprise multiple RFNMOS transistor.

44. The method of claim 25, wherein the one or more RFCMOS components comprise an radio frequency P-type metal-oxide semiconductor (RFPMOS) transistor.

45. The method of claim 25, wherein the one or more RFCMOS components comprise multiple RFPMOS transistor.

46. The method of claim 25, wherein the one or more RFCMOS components comprise an RFNMOS transistor and an RFPMOS transistor.

47. The method of claim 25, wherein the one or more RFCMOS components comprise one or more RFNMOS transistors and one or more RFPMOS transistors.

48. A method of reducing substrate coupling and noise for one or more radio frequency complimentary metal-oxide semiconductor (RFCMOS) components, comprising the steps of:
   providing a substrate having a frontside and a backside; wherein the substrate is a P-type wafer or an N-type wafer that is comprised of a material selected from the group consisting of silicon and germanium;
   forming one or more RFCMOS components over the substrate;
   forming one or more isolation structures within the substrate proximate the one or more (RFCMOS) components;
   etching the backside of the substrate to form respective trenches within the substrate and over at least the one or more isolation structures; and
   filling the respective trenches with dielectric material whereby the substrate coupling and noise for the one or more RFCMOS components are reduced.

49. The method of claim 48, wherein the substrate is comprised of silicon.

50. The method of claim 48, wherein the substrate is a semiconductor wafer.

51. The method of claim 48, wherein the one or more RFCMOS components comprise a MOS transistor formed upon the substrate and inductor coils formed over an interlevel dielectric (ILD) layer or an intermetal dielectric (IMD) layer formed over the MOS transistor.

52. The method of claim 48, wherein the dielectric material filling the trenches is comprised of a material selected from the group consisting of $SiO_2$, polyimide and a low-k dielectric material covered by a low temperature deposited oxide.

53. The method of claim 48, wherein the dielectric material filling the trenches is a low-k dielectric material having a dielectric constant of less than about 3 that is covered by a low temperature deposited oxide.

54. The method of claim 48, wherein the dielectric material filling the trenches is planarized.

55. The method of claim 48, wherein the dielectric material filling the trenches is planarized using a chemical mechanical polishing (CMP) process.

56. The method of claim 48, wherein the dielectric material filling the trenches is formed to a thickness of from about 5 to 300 $\mu$m above the etched substrate.

57. The method of claim 48, wherein the dielectric material 90 filling the trenches is formed to a thickness of from about 10 to 100 $\mu$m above the etched substrate.

58. The method of claim 48, wherein the dielectric material filling the trenches is planarized to a thickness of from about 0 to 5000 Å above the etched substrate.

59. The method of claim 48, wherein the dielectric material filling the trenches is planarized by a chemical mechanical process to a thickness of from about 0 to 1000 Å above the etched substrate.

60. The method of claim 48, wherein the respective trenches are etched within the backside of the substrate using a patterned masking layer formed over the backside of the substrate.

61. The method of claim 48, wherein the respective trenches are etched within the backside of the substrate using a patterned masking layer formed over the backside of the substrate; the patterned masking layer being comprised of a material selected from the group consisting of photoresist, positive photoresist and polyimide.

62. The method of claim 48, wherein the respective trenches are etched within the backside of the substrate using a patterned masking layer formed over the backside of the substrate; the patterned masking layer being comprised of positive photoresist.

63. The method of claim 48, wherein the respective trenches expose the one or more isolation structures.

64. The method of claim 48, wherein a protection layer is formed over the one or more isolation structures before the backside of the substrate is etched to form the respective trenches.

65. The method of claim 48, wherein the one or more RFCMOS components comprise an radio frequency N-type metal-oxide semiconductor (RFNMOS) transistor.

66. The method of claim 48, wherein the one or more RFCMOS components comprise multiple RFNMOS transistor.

67. The method of claim 48, wherein the one or more RFCMOS components comprise an radio frequency P-type metal-oxide semiconductor (RFPMOS) transistor.

68. The method of claim 48, wherein the one or more RFCMOS components comprise multiple RFPMOS transistor.

69. The method of claim 48, wherein the one or more RFCMOS components comprise an RFNMOS transistor and an RFPMOS transistor.

70. The method of claim 48, wherein the one or more RFCMOS components comprise one or more RFNMOS transistor and one or more RFPMOS transistors.

* * * * *

UNITED STATES PATENT AND TRADEMARK OFFICE
CERTIFICATE OF CORRECTION

PATENT NO.    : 6,638,844 B1                                                Page 1 of 1
DATED         : October 28, 2003
INVENTOR(S)   : Purakh Raj Verma et al.

It is certified that error appears in the above-identified patent and that said Letters Patent is hereby corrected as shown below:

<u>Title page,</u>
Item [75], delete "Chit Hwei, Singapore (SG)", and replace with -- Chit Hwei Ng, Singapore (SG) --.

Signed and Sealed this

Sixteenth Day of December, 2003

JAMES E. ROGAN
*Director of the United States Patent and Trademark Office*